(12) United States Patent
Park et al.

(10) Patent No.: US 11,460,058 B2
(45) Date of Patent: Oct. 4, 2022

(54) SEPARABLE INTEGRATED TYPE VIBRATION ISOLATOR

(71) Applicant: V-ONE Co., LTD., Asan-si (KR)

(72) Inventors: Haedong Park, Asan-si (KR); Kun Rok Park, Cheonan-si (KR); Kukhyun Ryu, Cheonan-si (KR); Kyungho Song, Cheonan-si (KR)

(73) Assignee: V-ONE Co., LTD., Asan-si (KR)

( * ) Notice: Subject to any disclaimer, the term of this patent is extended or adjusted under 35 U.S.C. 154(b) by 414 days.

(21) Appl. No.: 16/702,463

(22) Filed: Dec. 3, 2019

(65) Prior Publication Data

US 2020/0370580 A1 Nov. 26, 2020

(30) Foreign Application Priority Data

May 20, 2019 (KR) .................. 10-2019-0058780

(51) Int. Cl.
*F16B 5/02* (2006.01)
*F16F 7/00* (2006.01)
(Continued)

(52) U.S. Cl.
CPC ............ *F16B 5/0241* (2013.01); *F16F 7/003* (2013.01); *F16F 15/02* (2013.01); *F16M 5/00* (2013.01);
(Continued)

(58) Field of Classification Search
CPC .. F16F 15/04; F16F 1/40; F16F 1/3737; F16F 7/003; F16F 15/02; E04B 1/98;
(Continued)

(56) References Cited

U.S. PATENT DOCUMENTS 3,744,194 A * 7/1973 Ramberg ................ E04B 2/845
52/378
4,048,842 A * 9/1977 Baratoff ................... F16M 7/00
72/466.9
(Continued)

FOREIGN PATENT DOCUMENTS

CN 102852090 A 1/2013
JP 5-311922 A 11/1993
(Continued)

OTHER PUBLICATIONS

Office Action of CN201911220319 dated Jul. 26, 2021.

*Primary Examiner* — Jonathan Liu
*Assistant Examiner* — Taylor L Morris
(74) *Attorney, Agent, or Firm* — Revolution IP, PLLC (57) ABSTRACT

A separable integrated type vibration isolator includes: divided vibration isolator units comprising casings having accommodation spaces formed open on tops thereof and reinforced concrete comprising reinforcing bars arranged in the accommodation spaces and the connection spaces and concrete cast in the accommodation spaces; casing connection parts for connecting the casings of the divided vibration isolator units to each other; reinforcing bar connection parts for connecting the reinforcing bars exposed to the connection spaces of the neighboring divided vibration isolator units to each other; and fillers adapted to be cast in the connection spaces where the plurality of divided vibration isolator units is connected to form reinforced concrete.

7 Claims, 4 Drawing Sheets

(51) Int. Cl.
*F16F 15/02* (2006.01)
*F16M 5/00* (2006.01)
*F16M 9/00* (2006.01)
*G03F 7/20* (2006.01)
*E04G 13/00* (2006.01)
*E04G 17/075* (2006.01)

(52) U.S. Cl.
CPC ............... *F16M 9/00* (2013.01); *G03F 7/709* (2013.01); *E04G 13/00* (2013.01); *E04G 17/0758* (2013.01)

(58) Field of Classification Search
CPC .. E04C 3/26; E04C 5/165; F16M 7/00; F16M 1/00; F16M 5/00; F16M 9/00; E02D 27/44; E04G 17/04; E04G 17/00; E04G 13/00; F16B 5/0241
See application file for complete search history.

(56) References Cited

U.S. PATENT DOCUMENTS

| | | | | |
|---|---|---|---|---|
| 4,205,029 A * | 5/1980 | Forrest | .................. | E01D 2/04 52/223.6 |
| 4,850,777 A * | 7/1989 | Lawrence | ........... | F16B 37/0864 411/433 |
| 5,193,932 A * | 3/1993 | Wu | ................... | E04C 5/165 403/309 |
| 5,967,691 A * | 10/1999 | Lancelot, III | ........... | E04C 5/165 403/313 |
| 6,120,723 A * | 9/2000 | Butler | .................. | E04B 5/10 249/34 |
| 6,327,829 B1 * | 12/2001 | Taguchi | ................ | F16B 7/06 52/583.1 |
| 6,405,992 B1 * | 6/2002 | Palmer | ................. | F04D 29/605 52/742.16 |
| 6,658,810 B2 * | 12/2003 | DeLoach, Sr. | ............ | E04C 5/18 52/745.11 |
| 6,739,568 B2 * | 5/2004 | Whittaker | ............ | B60N 2/0232 248/562 |
| 6,773,198 B2 * | 8/2004 | Copping | ................. | E04C 5/165 403/313 |
| 6,832,454 B1 * | 12/2004 | Iyer | .......................... | E04G 5/08 52/223.4 |
| 6,918,567 B2 * | 7/2005 | Ward | ...................... | E04G 17/06 249/7 |
| 7,024,831 B1 * | 4/2006 | Clark | ........................ | E04B 5/08 249/19 |
| 8,348,224 B2 * | 1/2013 | McDonagh | ........... | E04G 17/064 249/34 |
| 8,375,676 B2 * | 2/2013 | Takakura | .................. | E04B 5/38 52/414 |
| 8,528,261 B2 * | 9/2013 | Whittaker | ............... | E02D 27/44 52/2.13 |
| 2003/0080742 A1 * | 5/2003 | Stofiel | ..................... | F16F 15/08 324/322 |
| 2014/0331581 A1 * | 11/2014 | Larkin | .................. | E04B 1/0038 52/309.4 |
| 2016/0161044 A1 * | 6/2016 | Halicek | .................... | F16M 5/00 290/1 A |
| 2018/0209115 A1 * | 7/2018 | Henriquez | .......... | E04G 17/0758 |

FOREIGN PATENT DOCUMENTS

| | | | | |
|---|---|---|---|---|
| JP | 2843204 B2 | 1/1999 | | |
| KR | 10-2004-0018711 A | 3/2004 | | |
| KR | 10-0791079 B1 | 1/2008 | | |
| KR | 10-2013-0103420 A | 9/2013 | | |
| KR | 101982195 B1 * | 5/2019 | ............. | F16F 15/02 |
| KR | 102002804 B1 * | 7/2019 | ............. | F16F 7/003 |
| KR | 102176141 B1 * | 4/2020 | ............. | F16F 15/02 |

\* cited by examiner

SEPARABLE INTEGRATED TYPE VIBRATION ISOLATOR

CROSS REFERENCE TO RELATED APPLICATION OF THE INVENTION

The present application claims the benefit of Korean Patent Application No. 10-2019-58780 filed in the Korean Intellectual Property Office on May 20, 2019, the entire contents of which are incorporated herein by reference.

BACKGROUND OF THE INVENTION

Field of the Invention

The present invention relates to a form-integral type separable vibration isolator, and more particularly, to a separable integrated type vibration isolator that is capable of having the same dynamic characteristics as a unitary type vibration isolator even if the vibration isolator has a separable integrated structure.

Background of the Related Art

Generally, a process of manufacturing a semiconductor device is carried out through various unit processes inclusive of photo lithography, etching, and thin film deposition, and to do such processes, accordingly, a variety of semiconductor manufacturing equipment is used.

Since the semiconductor manufacturing equipment performs such precise processes, it is very weak in vibrations transferred thereto from the outside, and so as to ensure high quality and yield of the semiconductor device, accordingly, a vibration isolator capable of removing the weakness in the vibrations has been proposed.

Conventional vibration isolators are configured to allow semiconductor manufacturing equipment to be disposed on tops thereof to prevent the semiconductor manufacturing equipment from being located directly on a floor, so that they can absorb and release a given quantity of external vibration.

Most of the conventional vibration isolators have a unitary body, however, so that a large space is needed for their installation and a lot of dust is generated.

So as to solve such problems, there is disclosed Korean Patent No. 10-0791079 entitled "vibration isolator and method for installing the same", and the conventional vibration isolator includes: an equipment support body having two or more equipment support cells and cell connection units passing through the sides of the equipment support cells to connect the equipment support cells to each other; and a floor structure disposed under the equipment support body to support the equipment support body.

However, the conventional vibration isolator fails to sufficiently consider improvement in a coupling force between the equipment support cells, thereby having a limitation in increasing durability of the equipment support cells, and so as to couple the equipment support cells to the floor structure, further, bolt fastening holes are formed on the equipment support cells, thereby causing the durability of the equipment support cells to be undesirably decreased. According to the conventional vibration isolator, furthermore, there are limits in improving vibration characteristics due to the separated structure of the equipment support cells.

SUMMARY OF THE INVENTION

Accordingly, the present invention has been made in view of the above-mentioned problems occurring in the related art, and it is an object of the present invention to provide a separable integrated type vibration isolator that is capable of restricting elastic modulus of fillers to allow the fillers and concrete pre-cast to have similar bending stiffness to each other, thereby minimizing differences between them and improving the vibration characteristics, capable of enhancing coupling forces between divided vibration isolator units, thereby improving durability of the divided vibration isolator units, capable of preventing a backlash from occurring when reinforcing bars of the divided vibration isolator units are connected to each other, thereby suppressing bending natural frequencies of the divided vibration isolator units from being decreased, stably transferring tensile and compressive loads to the reinforcing bars, and allowing the reinforcing bars to perform dynamic elastic modulus restoring functions with respect to vibrations well, capable of allowing integral separation of concrete and casings at the time when a bending moment is generated from the divided vibration isolator units, and capable of improving damping performance of the divided vibration isolator units, thereby controlling resonance response.

To accomplish the above-mentioned objects, according to the present invention, there is provided a separable integrated type vibration isolator including: a plurality of divided vibration isolator units comprising casings having accommodation spaces formed open on tops thereof in such a manner as to both side plates and bottom plates thereof to be extended horizontally to casing connection spaces and reinforced concrete comprising reinforcing bars arranged in the accommodation spaces and the connection spaces and concrete cast in the accommodation spaces; casing connection parts for connecting the casings of the plurality of divided vibration isolator units to each other so as to maintain a state where the connection spaces of the plurality of divided vibration isolator units are connected to each other; reinforcing bar connection parts for connecting the reinforcing bars exposed to the connection spaces of the neighboring divided vibration isolator units to each other; and fillers adapted to be cast in the connection spaces where the plurality of divided vibration isolator units is connected to form reinforced concrete, wherein the fillers have an elastic modulus of 50 to 200% of the concrete cast in the accommodation spaces.

According to the present invention, desirably, each casing connection part includes: fixing bolts fixed to the bottom plates of the respective connection spaces of the neighboring divided vibration isolator units by means of welding; a connection plate fitted to the fixing bolts and having a 1 to 5 times thickness of the bottom plate; and nuts fastened to the fixing bolts protruding from the connection plate to allow the connection plate to connect the neighboring divided vibration isolator units to each other.

According to the present invention, desirably, each reinforcing bar connection part includes: a connection nut coupled to male screw portions formed on the end peripheries of the reinforcing bars arranged in a row on the neighboring connection spaces to connect the reinforcing bars to each other; and looseness prevention nuts coupled to the male screw portions of the reinforcing bars in such a manner as to come into contact with both ends of the connection nut to prevent the connection nut from being loosened.

According to the present invention, desirably, each reinforcing bar connection part further includes locking washers disposed between the connection nut and the looseness prevention nuts in such a manner as to allow diameters thereof to be larger than widths of the connection nut and the looseness prevention nuts.

According to the present invention, desirably, the separable integrated type vibration isolator further includes shear keys disposed vertically on the bottom plates of the casings to prevent separation of the concrete, each shear key including: a post fixed vertically to the bottom surface of the corresponding casing by means of welding; and a head located on top of the post and having an expanded diameter or width from the post.

According to the present invention, desirably, the separable integrated type vibration isolator further includes shear keys disposed vertically on the bottom plates of the casings to prevent separation of the concrete, each shear key including: a fixing nut fixed to the bottom surface of the corresponding casing by means of welding; a connection bolt screw-coupled to the fixing nut in such a manner as to be installed vertically; a head located on top of the connection bolt and having an expanded diameter or width from the connection bolt; and a looseness prevention nut screw-coupled to the connection bolt in such a manner as to be located on top of the fixing nut.

According to the present invention, desirably, the separable integrated type vibration isolator further includes a damping pad disposed between the bottom plates of the casings and the concrete or the fillers in such a manner as to allow the shear keys to be passed therethrough.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE EMBODIMENTS

The present invention may be modified in various ways and may have several exemplary embodiments. Specific exemplary embodiments of the present invention are illustrated in the drawings and described in detail in the detailed description. However, this does not limit the invention within specific embodiments and it should be understood that the invention covers all the modifications, equivalents, and replacements within the idea and technical scope of the invention.

Hereinafter, the present invention is disclosed with reference to the attached drawings wherein the corresponding parts in the embodiments of the present invention are indicated by corresponding reference numerals and the repeated explanation on the corresponding parts will be avoided. If it is determined that the detailed explanation on the well known technology related to the present invention makes the scope of the present invention not clear, the explanation will be avoided for the brevity of the description.

Figure 1:
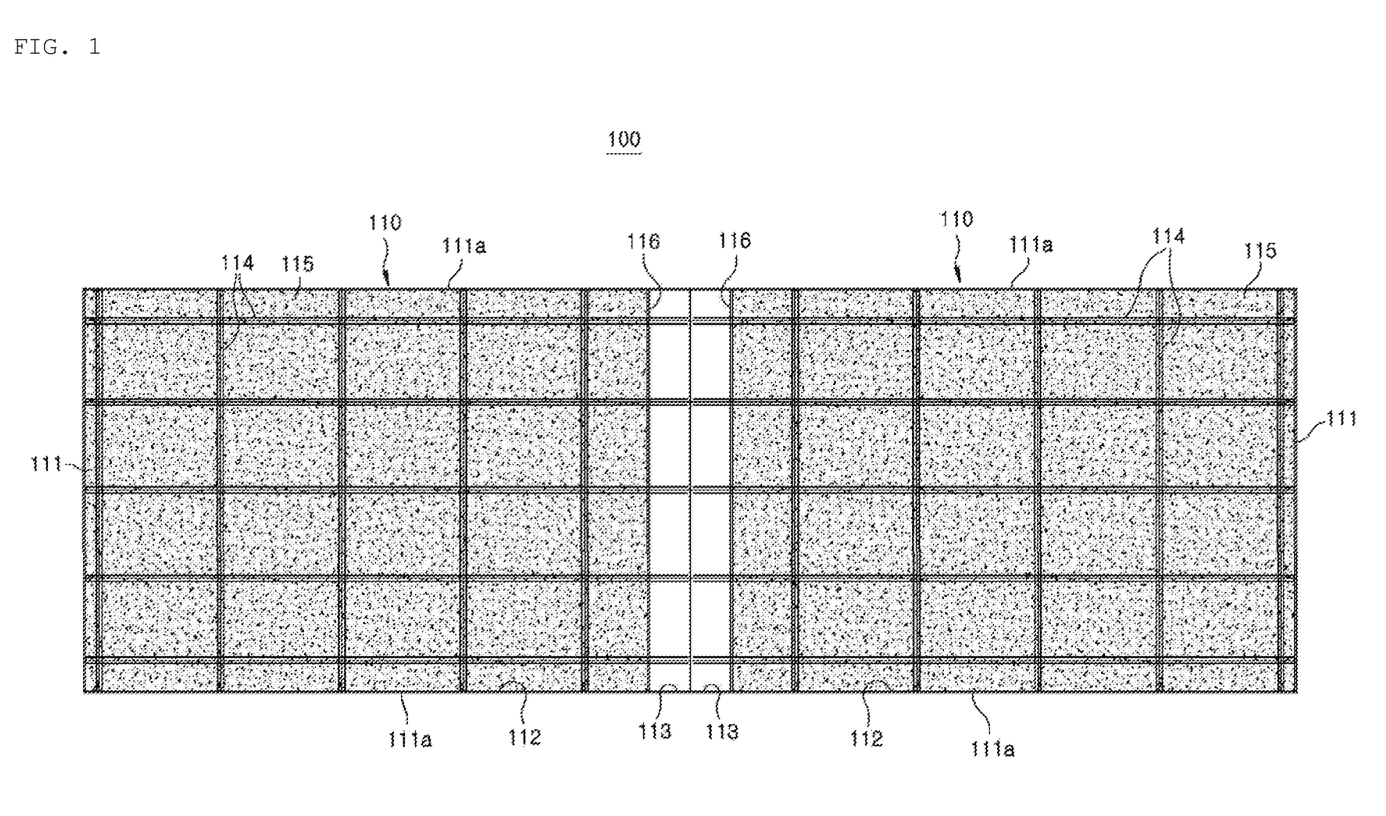
FIG. 1 is a plan view showing a separable integrated type vibration isolator according to a first embodiment of the present invention.
Figure 2:
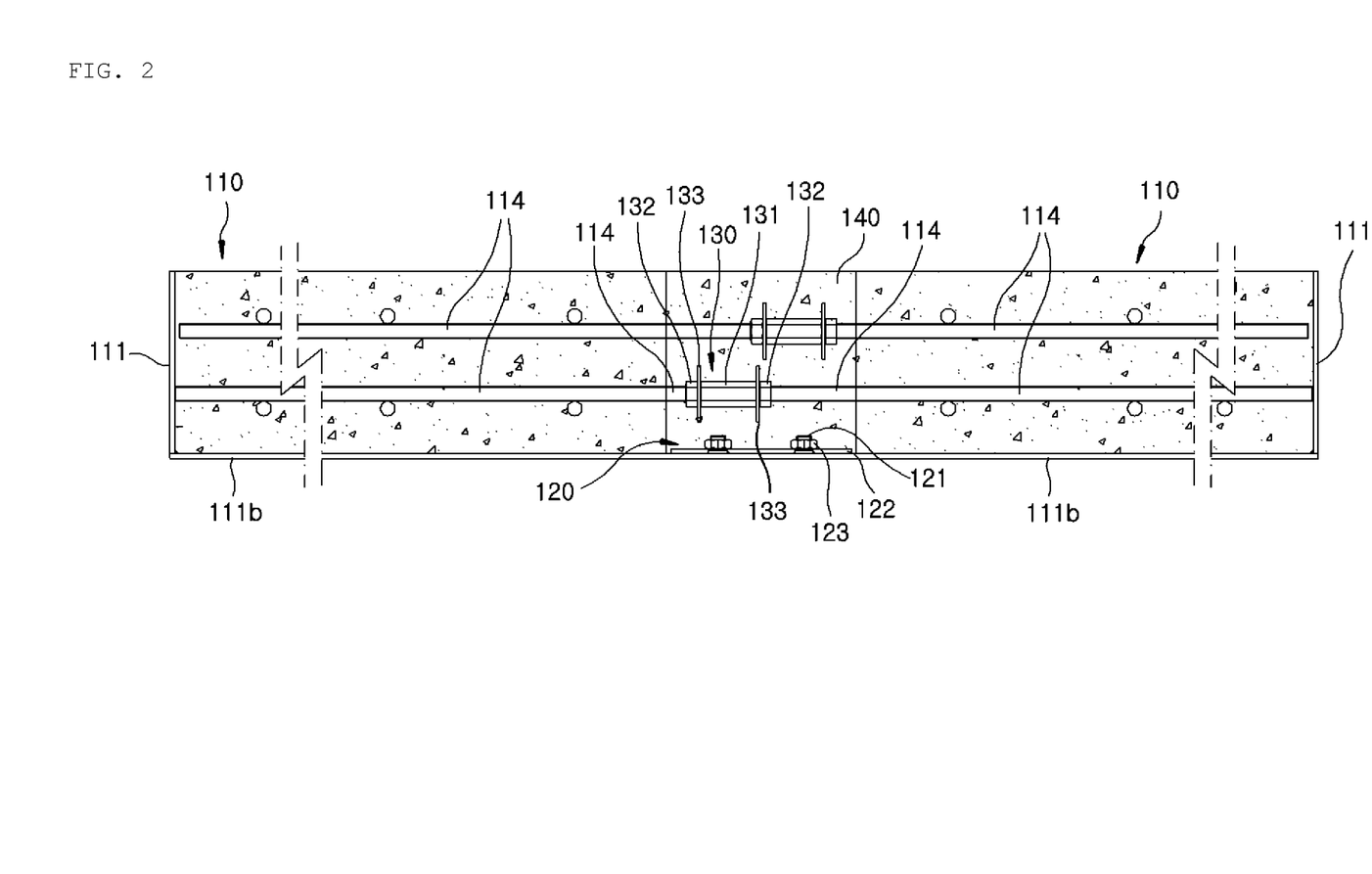
FIG. 2 is a side sectional view showing the separable integrated type vibration isolator according to the first embodiment of the present invention.

FIG. 1 is a plan view showing a separable integrated type vibration isolator according to a first embodiment of the present invention, and FIG. 2 is a side sectional view showing the separable integrated type vibration isolator according to the first embodiment of the present invention.

As shown in FIGS. 1 and 2, a separable integrated type vibration isolator 100 according to the first embodiment of the present invention includes a plurality of divided vibration isolator units 110, casing connection parts 120, reinforcing bar connection parts 130, and fillers 140. The plurality of divided vibration isolator units 110 is coupled to each other and then mounted on a floor structure. In this case, the floor structure is a structure built on a floor on which semiconductor equipment is installed, that is, on a floor of a clean room, and it is formed of various beam assemblies, such as lattice beams having H-beams in the form of a lattice, reinforced concrete beams, or reinforced concrete slabs.

The divided vibration isolator units 110 include casings 111 having accommodation spaces 112 formed open on tops thereof in such a manner as to both side plates 111a and bottom plates 111b thereof to be extended horizontally to form connection spaces 113, reinforcing bars 114 arranged in the accommodation spaces 112 and the connection spaces 113 in up and down and horizontal and vertical directions, and concrete 115 adapted to be cast in the accommodation spaces 112 to form reinforced concrete together with the reinforcing bars 114. Each divided vibration isolator unit 110 has the connection space 113 formed only on one side thereof, but without being limited thereto, the connection space 113 may be formed on two, three, or four sides of the divided vibration isolator unit 110. Also, each casing 111 serves as a form made of a steel material and further as a reinforcing material at the time when the plurality of divided vibration isolator units 110 are integral with each other.

The casing connection parts 120 connect the casings 111 of the divided vibration isolator units 110 to each other so as to maintain a state where the connection spaces 113 of the divided vibration isolator units 110 are connected to each other. For example, each casing connection part 120 includes fixing bolts 121 fixed to the bottom plates 111b of the connection spaces 113 of the neighboring divided vibration isolator units 110, that is, to the bottom plates 111b of the casings 111, by means of welding, a connection plate 122 fitted to the fixing bolts 121 and having a 1 to 5 times thickness of the bottom plates 111b of the casings 111, and nuts 123 fastened to the fixing bolts 121 protruding from the connection plate 122 to allow the connection plate 122 to connect the neighboring divided vibration isolator units 110 to each other. The connection plate 122 has through holes penetrated thereinto to fit the fixing bolts 121 thereto. A maximum bending moment is generated on a connection portion between the divided vibration isolator units 110, and tensile forces generated from the bottom plates 111b of the casings 111 are larger than those generated from the reinforcing bars located on the lower portions of the casings 111. A natural frequency by a bending mode of the vibration isolator 100 has an influence on bending stiffness (multiplication of section modulus by elastic modulus), and accordingly, the connection plate 122 has to have the same bending stiffness as the bottom plates 111b of the casings 111 so as to prevent the natural frequency from being decreased by the connection of the casings 111. As a result, the connection plate 122 has a 1 to 5 times thickness of the bottom plates 111*b* of the casings 111 in a range of satisfying economical construction.

The reinforcing bar connection parts 130 serve to connect the reinforcing bars 114 exposed to the connection spaces 113 of the neighboring divided vibration isolator units 110 with each other. Each reinforcing bar connection part 130 includes a connection nut 131 coupled to male screw portions formed on the end peripheries of the reinforcing bars 114 arranged in a row on the neighboring connection spaces 113 to connect the reinforcing bars 114 to each other and looseness prevention nuts 132 coupled to the male screw portions of the reinforcing bars 114 in such a manner as to come into contact with both ends of the connection nut 131 to prevent the connection nut 131 from being loosened. Further, each reinforcing bar connection part 130 includes locking washers 133 disposed between the connection nut 131 and the looseness prevention nuts 132 in such a manner as to allow diameters thereof to be larger than widths of the connection nut 131 and the looseness prevention nuts 132. Since the diameters of the locking washers 133 are larger than the widths of the connection nut 131 and the looseness prevention nuts 132, accordingly, it can allow the connection nut 131 and the looseness prevention nuts 132 to be inserted into the concrete 115, thereby achieving rigid fixing. If the reinforcing bars 114 are screw-connected to each other, a backlash occurs by screw threads needed for the screw-coupling, so that tensile/compressive loads upon small displacement are not transferred to the reinforcing bars 114 to be connected to each other, and dynamic elastic modulus restoring functions of the reinforcing bars 114 with respect to vibrations cannot be performed well. Through tests, the backlash causes the bending natural frequencies of the divided vibration isolator units 110 to be disadvantageously decreased, and through the use of the looseness prevention nuts 132, accordingly, the backlash caused by the tension and compression can be prevented.

The fillers 140 serve to form reinforced concrete together with the reinforcing bars 114 located in the connection spaces 113 through casting of concrete into the connected connection spaces 113 of the divided vibration isolator units 110 and have an elastic modulus of 50 to 200% of the concrete 115 cast in the accommodation spaces 112. In addition to the concrete, of course, each filler 140 further includes mortar, epoxy, and so on. In this case, if the elastic modulus of each filler 140 is 50% less than and 200% more than that of the concrete 115 cast in the accommodation spaces 112, undesirably, differences in the dynamic characteristics between the fillers 140 and the reinforced concrete in the accommodation spaces 112 are increased.

Figure 3:
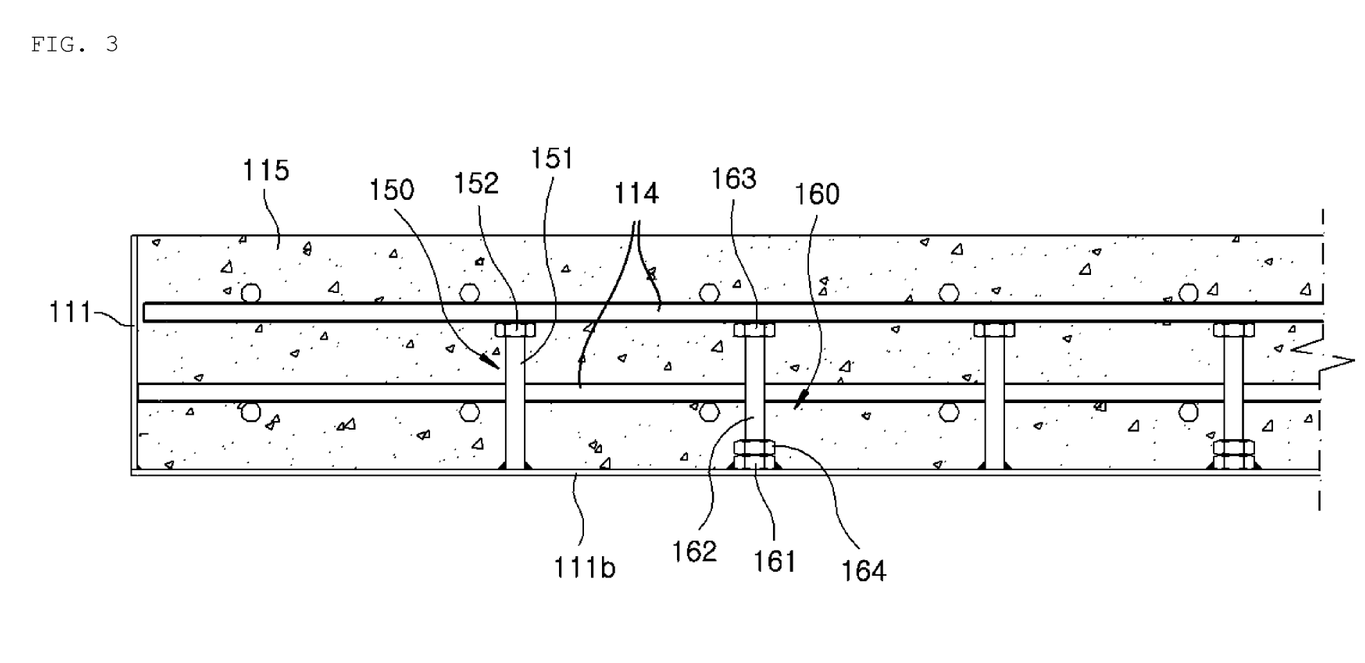
FIG. 3 is a side sectional view showing a separable integrated type vibration isolator according to a second embodiment of the present invention.

As shown in FIG. 3, a separable integrated type vibration isolator according to a second embodiment of the present invention is configured to further have shear keys 150 disposed vertically on the bottom plates 111*b* of the casings 111 to prevent separation of concrete. The shear keys 150 are arranged two-dimensionally on the bottom plates 111*b* of the casings 111, and according to a third embodiment of the present invention as will be discussed later, also, they can be applied in the same manner as above. The shear keys 150 allow the concrete 115, the reinforcing bars 114 and the casings 111 to perform integral separation at the time when a bending moment is generated from the vibration isolator 100, thereby providing excellent durability and structural stability for the vibration isolator 100. For example, each shear key 150 includes a post 151 fixed vertically to the bottom surface 111*b* of the corresponding casing 111 by means of welding and a head 152 located on top of the post 151 and having an expanded diameter or width from the post 151.

For another example, shear keys 160 are provided to cause no interference with movements of workers, transfer of materials, or arrangements of the reinforcing bars 114, so that they can be conveniently installed in a desired process. Each shear key 160 includes a fixing nut 161 fixed to the bottom surface 111*b* of the corresponding casing 111 by means of welding, a connection bolt 162 screw-coupled to the fixing nut 161 in such a manner as to be installed vertically, a head 163 located on top of the connection bolt 162 and having an expanded diameter or width from the connection bolt 162, and a looseness prevention nut 164 screw-coupled to the connection bolt 162 in such a manner as to be located on top of the fixing nut 161. In this case, the head 163 can be formed integrally with top of the connection bolt 162 like the shear key 150, and otherwise, it can be formed of a nut screw-fastened to the top end periphery of the connection bolt 162 like the shear key 160.

Figure 4:
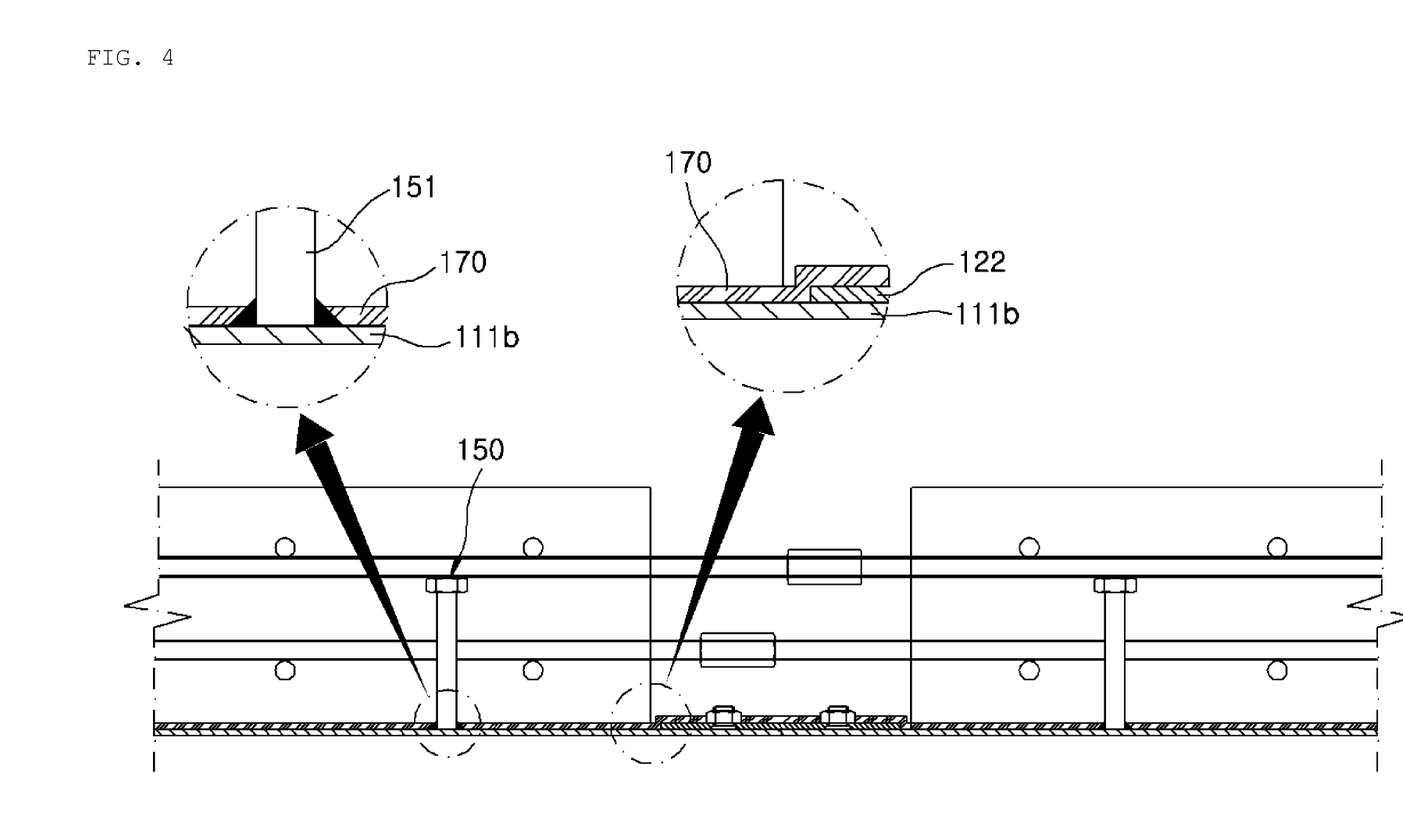
FIG. 4 is a side sectional view showing a separable integrated type vibration isolator according to a third embodiment of the present invention.

As shown in FIG. 4, a separable integrated type vibration isolator according to a third embodiment of the present invention is configured to further have a damping pad 170 disposed between the bottom plates 111*b* of the casings 111 and the concrete 115 or the fillers 140 in such a manner as to allow the shear keys 150 to be passed therethrough, and the damping pad 170 is made of rubber, synthetic resin, or other materials capable of having a damping function. In more detail, the damping pad 170 is disposed between the bottom plates 111*b* of the casings 111 and the concrete 115 and between the bottom plates 111*b* of the casings 111 and the fillers 140, and according to the third embodiment of the present invention, the damping pad 170 can be disposed on tops of the connection plates 122 located on tops of the bottom plates 111*b* of the casings 111.

On the other hand, vibrations on the vibration isolator 100 have various vibration characteristics, and a resonance frequency in the bending mode of the vibration isolator 100 corresponds to a forcing frequency occurring on the bottom of the vibration isolator 100 as a support foundation or on upper equipment disposed on top of the vibration isolator 100, thereby generating resonance response. So as to control the resonance response, it is possible that thickness, material, and size of the vibration isolator 100 can be varied, but since the resonance response is most effective when the damping performance of the vibration isolator 100 is increased, the damping pad 170 is provided to ensure the damping performance of the vibration isolator 100.

As described above, the separable integrated type vibration isolator according to the present invention can restrict the elastic modulus of the fillers to allow the fillers and the concrete pre-cast to have similar bending stiffness to each other, thereby minimizing differences between them and improving the vibration characteristics.

Also, the separable integrated type vibration isolator according to the present invention can enhance the coupling force between the divided vibration isolator units, thereby improving durability of the divided vibration isolator units and can prevent the backlash from occurring when the reinforcing bars of the divided vibration isolator units are connected to each other, thereby suppressing the bending natural frequencies of the divided vibration isolator units from being decreased, stably transferring the tensile and compressive loads to the reinforcing bars, and allowing the reinforcing bars to perform dynamic elastic modulus restoring functions with respect to vibrations well.

Further, the separable integrated type vibration isolator according to the present invention can allow integral separation of the concrete and the casings at the time when a bending moment is generated from the divided vibration isolator units and can improve the damping performance thereof, thereby controlling resonance response.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A separable integrated type vibration isolator comprising:
a plurality of divided vibration isolator units comprising casings having accommodation spaces formed open on tops thereof in such a manner as to both side plates and bottom plates thereof to be extended horizontally to casing connection spaces and reinforced concrete comprising reinforcing bars arranged in the accommodation spaces and the connection spaces and concrete cast in the accommodation spaces;
casing connection parts for connecting the casings of the plurality of divided vibration isolator units to each other so as to maintain a state where the connection spaces of the plurality of divided vibration isolator units are connected to each other;
reinforcing bar connection parts for connecting the reinforcing bars exposed to the connection spaces of the neighboring divided vibration isolator units to each other; and
fillers adapted to be cast in the connection spaces where the plurality of divided vibration isolator units is connected to form reinforced concrete,
wherein the fillers have an elastic modulus of 50 to 200% of the concrete cast in the accommodation spaces,
wherein each casing connection part comprises:
fixing bolts fixed to the bottom plates of the connection spaces of the neighboring divided vibration isolator units by means of welding;
a connection plate fitted to the fixing bolts and having a 1 to 5 times thickness of the bottom plate; and
nuts fastened to the fixing bolts protruding from the connection plate to allow the connection plate to connect the neighboring divided vibration isolator units to each other.

2. The separable integrated type vibration isolator according to claim 1, wherein each reinforcing bar connection part comprises:
a connection nut coupled to male screw portions formed on end peripheries of the reinforcing bars arranged in a row on the neighboring connection spaces to connect the reinforcing bars to each other; and
looseness prevention nuts coupled to the male screw portions of the reinforcing bars at both ends of the connection nut to prevent the connection nut from being loosened.

3. The separable integrated type vibration isolator according to claim 2, wherein each reinforcing bar connection part further comprises locking washers disposed between the connection nut and the looseness prevention nuts in such a manner as to allow diameters thereof to be larger than widths of the connection nut and the looseness prevention nuts.

4. A separable integrated type vibration isolator comprising:
a plurality of divided vibration isolator units comprising casings having accommodation spaces formed open on tops thereof in such a manner as to side plates and bottom plates thereof to be extended horizontally to casing connection spaces and reinforced concrete comprising reinforcing bars arranged in the accommodation spaces and the connection spaces and concrete cast in the accommodation spaces;
casing connection parts for connecting the casings of the plurality of divided vibration isolator units to each other so as to maintain a state where the connection spaces of the plurality of divided vibration isolator units are connected to each other;
reinforcing bar connection parts for connecting the reinforcing bars exposed to the connection spaces of the neighboring divided vibration isolator units to each other;
fillers adapted to be cast in the connection spaces where the plurality of divided vibration isolator units is connected to form reinforced concrete; and
shear keys disposed vertically on the bottom plates of the casings to prevent separation of the concrete, each shear key comprising:
a post fixed vertically to the bottom surface of the corresponding casing by means of welding; and
a head located on top of the post and having an expanded diameter or width from the post,
wherein the fillers have an elastic modulus of 50 to 200% of the concrete cast in the accommodation spaces.

5. The separable integrated type vibration isolator according to claim 4, further comprising a damping pad disposed between the bottom plates of the casings and the concrete or the fillers in such a manner as to allow the shear keys to be passed therethrough.

6. A separable integrated type vibration isolator comprising:
a plurality of divided vibration isolator units comprising casings having accommodation spaces formed open on tops thereof in such a manner as to side plates and bottom plates thereof to be extended horizontally to casing connection spaces and reinforced concrete comprising reinforcing bars arranged in the accommodation spaces and the connection spaces and concrete cast in the accommodation spaces;
casing connection parts for connecting the casings of the plurality of divided vibration isolator units to each other so as to maintain a state where the connection spaces of the plurality of divided vibration isolator units are connected to each other;
reinforcing bar connection parts for connecting the reinforcing bars exposed to the connection spaces of the neighboring divided vibration isolator units to each other;
fillers adapted to be cast in the connection spaces where the plurality of divided vibration isolator units is connected to form reinforced concrete; and
shear keys disposed vertically on the bottom plates of the casings to prevent separation of the concrete, each shear key comprising:
a fixing nut fixed to the bottom surface of the corresponding casing by means of welding;
a connection bolt screw-coupled to the fixing nut in such a manner as to be installed vertically;

a head located on top of the connection bolt and having an expanded diameter or width from the connection bolt; and
   a looseness prevention nut screw-coupled to the connection bolt in such a manner as to be located on top of the fixing nut,
   wherein the fillers have an elastic modulus of 50 to 200% of the concrete cast in the accommodation spaces.

7. The separable integrated type vibration isolator according to claim 6, further comprising a damping pad disposed between the bottom plates of the casings and the concrete or the fillers in such a manner as to allow the shear keys to be passed therethrough.

* * * * *